(12) United States Patent
Yoon et al.

(10) Patent No.: US 8,497,575 B2
(45) Date of Patent: Jul. 30, 2013

(54) SEMICONDUCTOR PACKAGING SYSTEM WITH AN ALIGNED INTERCONNECT AND METHOD OF MANUFACTURE THEREOF

(75) Inventors: In Sang Yoon, Ichon-si (KR); JoHyun Bae, Seoul (KR); DeokKyung Yang, Hanam-si (KR)

(73) Assignee: STATS Chippac Ltd., Singapore (SG)

( * ) Notice: Subject to any disclaimer, the term of this patent is extended or adjusted under 35 U.S.C. 154(b) by 92 days.

(21) Appl. No.: 12/710,359

(22) Filed: Feb. 22, 2010

(65) Prior Publication Data

US 2011/0204508 A1 Aug. 25, 2011

(51) Int. Cl.
*H01L 21/00* (2006.01)
*H01L 21/44* (2006.01)
*H01L 23/02* (2006.01)
*H01L 23/06* (2006.01)
*H01L 23/48* (2006.01)
*H01L 23/28* (2006.01)

(52) U.S. Cl.
USPC ........... 257/678; 257/684; 257/697; 257/701; 257/774; 257/787; 257/E21.503; 257/E21.508; 257/E23.004; 438/112; 438/127; 438/612

(58) Field of Classification Search
USPC .............. 257/678, 684, 697, 701, 774, 787, 257/E21.503, E21.508, E23.004; 438/612, 438/112, 127
See application file for complete search history.

(56) References Cited

U.S. PATENT DOCUMENTS

| | | | |
|---|---|---|---|
| 4,616,406 A * | 10/1986 | Brown | 438/106 |
| 5,250,843 A | 10/1993 | Eichelberger | |
| 5,341,564 A * | 8/1994 | Akhavain et al. | 29/832 |
| 6,055,049 A | 4/2000 | Mueller | |
| 6,567,713 B2 | 5/2003 | Lichtenstein et al. | |
| 6,780,746 B2 * | 8/2004 | Kinsman et al. | 438/612 |
| 6,791,076 B2 * | 9/2004 | Webster | 250/239 |
| 6,797,539 B2 * | 9/2004 | Wada et al. | 438/110 |
| 6,800,950 B2 * | 10/2004 | Teshima et al. | 257/797 |
| 6,844,617 B2 * | 1/2005 | Hung et al. | 257/678 |
| 7,185,426 B1 | 3/2007 | Hiner et al. | |
| 7,508,515 B2 | 3/2009 | Hanina et al. | |
| 2003/0208740 A1 | 11/2003 | Tourne et al. | |

* cited by examiner

*Primary Examiner* — Charles Garber
*Assistant Examiner* — Ron Pompey
(74) *Attorney, Agent, or Firm* — Ishimaru & Associates LLP (57) ABSTRACT

A method of manufacture of a semiconductor packaging system includes: providing a base substrate having edges; mounting an electrical interconnect on the base substrate; and applying an encapsulant having a reference marker and an opening over the electrical interconnect, the reference marker around the electrical interconnect based on physical locations of the edges.

20 Claims, 5 Drawing Sheets

SEMICONDUCTOR PACKAGING SYSTEM WITH AN ALIGNED INTERCONNECT AND METHOD OF MANUFACTURE THEREOF

TECHNICAL FIELD

The present invention relates generally to a semiconductor packaging system, and more particularly to an interconnect package system.

BACKGROUND ART

It is very important for products to continue to improve in features, performance, and reliability while reducing product costs, product size, and equally important to be available quickly for purchase by the consumers or buyers. Products must compete in world markets and attract many consumers or buyers in order to be successful.

Electronic products such as cell phone base products, global positioning systems (GPS), satellites, communication equipment, consumer products, and a vast line of other similar products are in ever increasing global demand. Market growth for high density and high output/input integrated circuit packages has resulted in a trend for electronic products that are lightweight, smaller in size, multi-functional, and with ever increasing higher speeds.

Therefore, there is an important need for smaller packages. The smaller packages need to electrically connect with other parts and components. As the smaller packages with more circuits continue to get shrink in size, there is a greater need to produce the smaller packages with more and more package connectors to support continually increasing amounts of electrical connections to and from those smaller packages.

Thus, an increasing need remains to increase the electrical connections of packages as the sizes of the packages continue to shrink in size while the circuits inside those packages continue to increase. It is also critical that the electrical connections are created and placed with precision so that each of the electrical connections is spaced apart from one another. The smaller packages and their electrical connections must be able to be connected to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of a semiconductor packaging system including: providing a base substrate having edges; mounting an electrical interconnect on the base substrate; and applying an encapsulant having a reference marker and an opening over the electrical interconnect, the reference marker around the electrical interconnect based on physical locations of the edges.

The present invention provides a semiconductor packaging system, including: a base substrate having edges; an electrical interconnect mounted to the base substrate; and an encapsulant having a reference marker and an opening over the electrical interconnect, the reference marker around the electrical interconnect based on physical locations of the edges.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

With molded laser packages under development, a key quality check for small semiconductor packaging systems is the amount of ball to hole misalignment detected after a laser ablation on a solder ball area. It is important to find an accurate datum or coordinate before performing the laser ablation, such as a partial removal or destruction, on the solder ball area.

A critical need exists to improve the method and process of generating a more accurate datum beyond the use of ablation positions using fiducial marks. Embodiments of the present invention provides methods/solutions to these critical needs.

Figure 1:
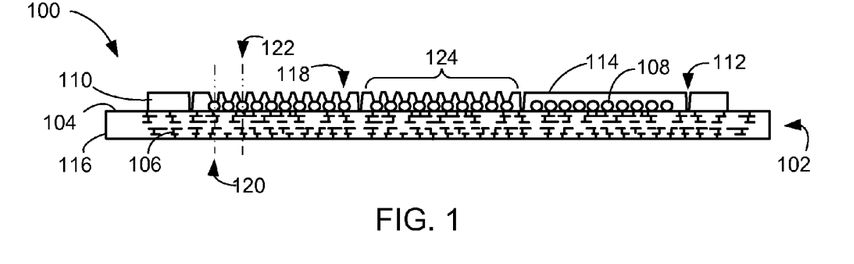
FIG. 1 is a cross-sectional view of a semiconductor packaging system taken along a line 1-1 of FIG. 2 in a first embodiment of the present invention.
Figure 2:
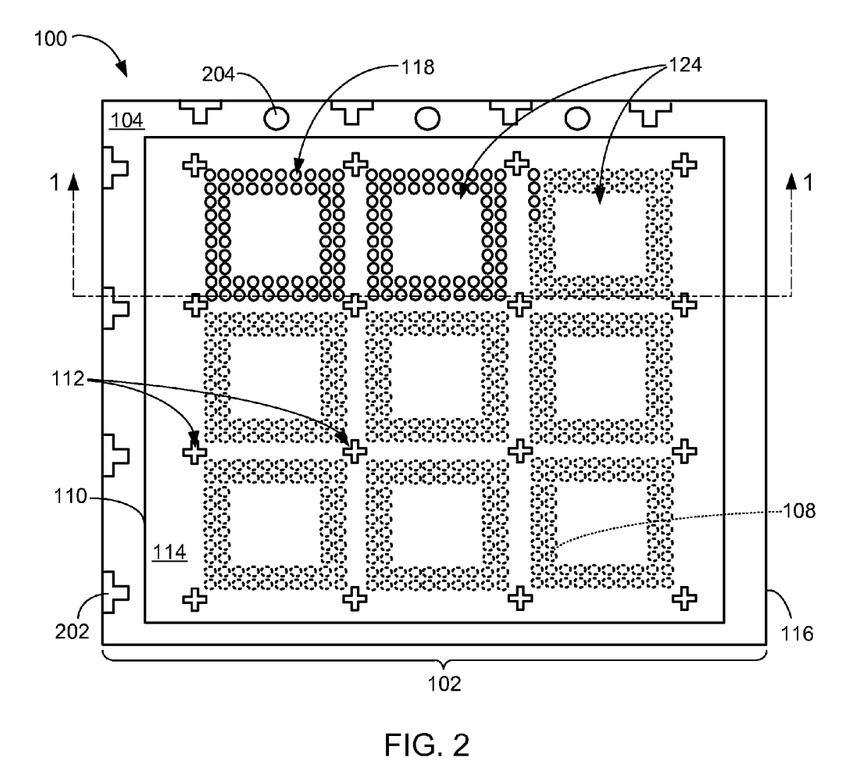
FIG. 2 is a top view of the semiconductor packaging system of FIG. 1.

Referring now to FIG. 1, therein is shown a cross-sectional view of a semiconductor packaging system 100 taken along a line 1-1 of FIG. 2 in a first embodiment of the present invention. The semiconductor packaging system 100 can preferably include a base substrate 102, such as a printed circuit board, a substrate, or a circuit board having a protected side 104, a side of the base substrate 102 opposite the protected side 104, base conductors 106, and electrical interconnects 108.

The base conductors 106 can provide electrical connectivity through the base substrate 102 including the protected side 104 and the side opposite the protected side 104. The base conductors 106 can be formed using materials that are electrically conductive.

The electrical interconnects 108, such as balls, bumps, pads, pins, leads, or solder, can preferably be mounted on the protected side 104. The electrical interconnects 108 can be electrically connected directly to the base conductors 106 on the protected side 104 and have different physical sizes or shapes.

An encapsulant 110 can be applied over the electrical interconnects 108 and a portion of the protected side 104. The encapsulant 110 can be formed using materials such as an epoxy, an epoxy blend, a silicone material, or a molding compound having similar properties.

The encapsulant 110 can include reference markers 112, such as fiducial patterns, indentations, or holes, applied or formed in an encapsulant side 114 of the encapsulant 110 facing away from the protected side 104. The reference markers 112 can be formed with a laser. The reference markers 112 can penetrate the encapsulant 110 from the encapsulant side 114 to the protected side 104 of the base substrate 102 or into a portion of the encapsulant 110.

Physical locations of the reference markers 112 are selected and positioned relative to edges 116, strip edge patterns 202 of FIG. 2, or assembly holes 204 of FIG. 2 of the base substrate 102. Manufacturing information based on physical locations and triangulation calculations of the edges 116, the strip edge patterns 202, or the assembly holes 204 can be used for formation or placement positioning of each of the reference markers 112. Quantity of the reference markers 112 can be determined based on distribution patterns of the electrical interconnects 108. The reference markers 112 or patterns of several of the reference markers 112 can be used to locate, triangulate, or determine physical locations of any of the electrical interconnects 108 covered or obstructed by the encapsulant 110.

The encapsulant 110 can include openings 118 such as holes, passages, apertures, or indentations directly over the electrical interconnects 108, to expose the electrical interconnects 108 in the openings 118. Physical placement locations of the openings 118 are selected and positioned relative to the reference markers 112 using information based on physical locations of the reference markers 112 and triangulation calculations based on the physical locations of each of the reference markers 112 separated from one another.

The openings 118 can be formed using a removal process, such as a laser ablation, a sonic drilling, or a micro-etching process, to the encapsulant side 114. Each of the openings 118 can be perpendicular to the encapsulant side 114. The openings 118 can partially or fully expose the electrical interconnects 108 from the encapsulant 110.

The electrical interconnects 108 exposed from the encapsulant side 114. The electrical interconnects 108 are in the openings 118 and exposed below non-horizontal sides of the openings 118, can provide electrical or thermal connectivity between the semiconductor packaging system 100 and a next level of integration such as an integrated circuit packaging, a subsystem circuit board, circuitry, test equipment, or any component capable of attaching to the electrical interconnects 108.

The openings 118 on the encapsulant side 114 can provide connectivity between the electrical interconnects 108 of the semiconductor packaging system 100 and a next level of connectivity such as an integrated circuit packaging, a subsystem circuit board, circuitry, test equipment, or any electrical or electronic based component. The openings 118 can be vertically aligned with the electrical interconnects 108. A central axis 120 of each of the openings 118 can coincide with a central axis 122 of the electrical interconnects 108.

The electrical interconnects 108 can be distributed and patterned over the protected side 104 into plurality of patterned areas 124, such as unit, cluster, or base areas. Any of the patterned areas 124 can be shaped identically or differently from another one of the patterned areas 124. Also, any of the patterned areas 124 can have a size identical or different from another one of the patterned areas 124.

It has been discovered that use of the laser ablation process for the formation of the openings 118, and the reference markers 112 requires no additional tooling cost, no special technology, or any special equipment.

It has been further discovered that the reference markers 112 provide manufacturing machines with additional positional information resulting in accuracy improvements in formation of the openings 118. The additional positional information can include physically mapped planar X-Y dimensional coordinates or multiple X-Y-Z dimensional coordinates relative to the reference markers 112.

Referring now to FIG. 2, therein is shown a top view of the semiconductor packaging system 100 of FIG. 1. Shown are the base substrate 102, the protected side 104 of the base substrate 102, the encapsulant 110 covering a portion of the protected side 104, the reference markers 112 in the encapsulant side 114 of the encapsulant 110, and the openings 118 of the encapsulant 110.

The strip edge patterns 202, such as fiducial marks or edge indices, or pcb symbols/characters, can be located on the edges 116 of the base substrate 102 and aligned with perimeters of any of the patterned areas 124. The strip edge patterns 202 or the edges 116 can be used to triangulate, locate, and identify positions used for the formation of the reference markers 112 as well as locating each of the patterned areas 124.

The electrical interconnects 108 located within the encapsulant 110 are shown as hidden lines. The openings 118, positioned and located relative to the reference markers 112 are formed over the electrical interconnects 108 and exposing at least a portion of the electrical interconnects 108.

Also shown are the assembly holes 204 formed on the base substrate 102 between the edges 116 and the encapsulant 110 or between pairs of the strip edge patterns 202. The assembly holes 204 can be used to maneuver or provide support of any manufacturing processes or specific user requirements. The assembly holes 204 can be used to provide additional referencing points during the forming phases of the reference markers 112.

Figure 3:
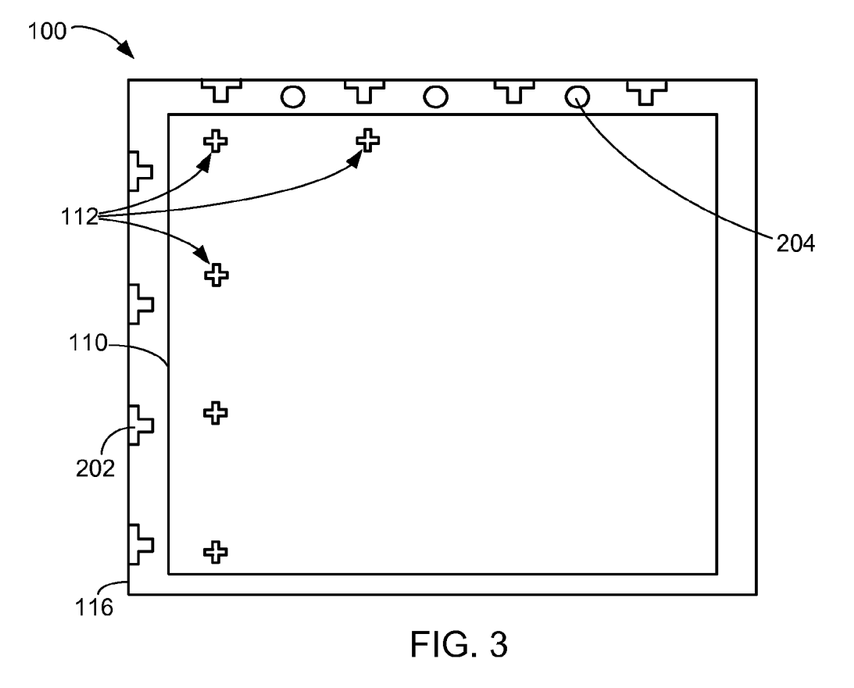
FIG. 3 is the structure of FIG. 2 in a marking phase of manufacture.

Referring now to FIG. 3, therein is shown the structure of FIG. 2 in a marking phase of manufacture. Shown are the reference markers 112, the encapsulant 110, the strip edge patterns 202, the edges 116, and the assembly holes 204.

Placement positions for the reference markers 112 are determined using the strip edge patterns 202 on the edges 116 or the assembly holes 204 closest to one or more of the edges 116 as locator references. The physical locations of the reference markers 112 are selected and positioned relative to the strip edge patterns 202, the assembly holes 204, or the edges 116.

The reference markers 112 are formed on the encapsulant 110 at the placement positions using a marking phase. The marking phase can include a cutting, a carving, an etching, or a printing process using a laser. The reference markers 112 formed by the laser can also be referred to as laser fiducial patterns.

Figure 4:
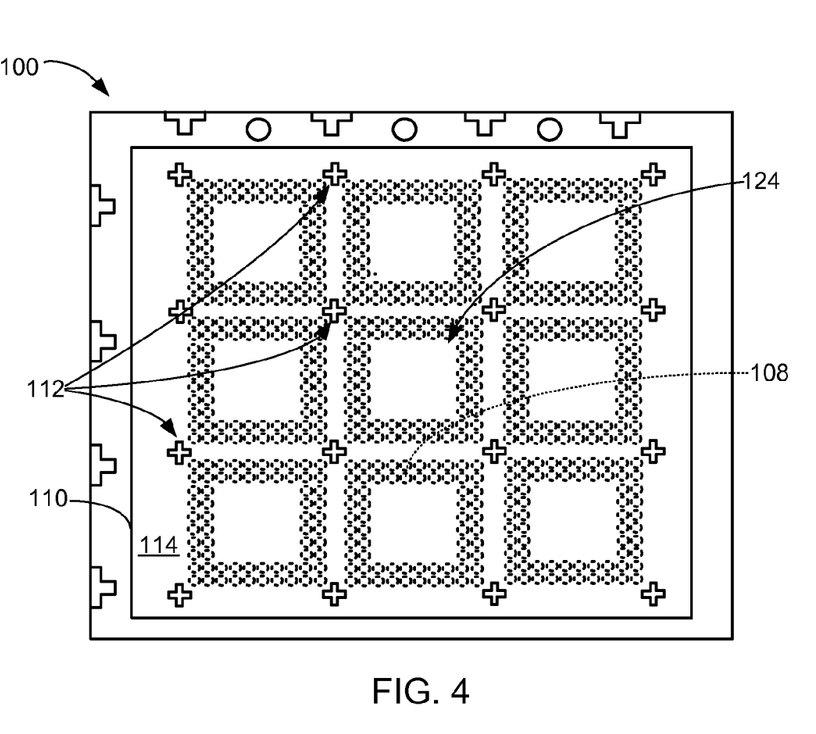
FIG. 4 is the structure of FIG. 3 in a pattern recognition phase.

Referring now to FIG. 4, therein is shown the structure of FIG. 3 in a pattern recognition phase. Shown are the reference markers 112 formed on the encapsulant side 114 of the encapsulant 110 and the patterned areas 124 surrounded by the reference markers 112.

Locations of the electrical interconnects 108, shown as hidden lines, are determined during a pattern recognition phase using a pattern recognition system that can include passive or active sensors such as optical sensors, sonic sensors, density/mass sensors, or radiographic sensors.

During the pattern recognition phase, the pattern recognition system can record or map the physical locations of the electrical interconnects 108 relative to the reference markers 112. The pattern recognition system is based on the laser fiducial patterns.

It has also been discovered that the reference markers 112 formed using the laser can provide more accurate positional information during the pattern recognition phase for locating the electrical interconnects 108.

Figure 5:
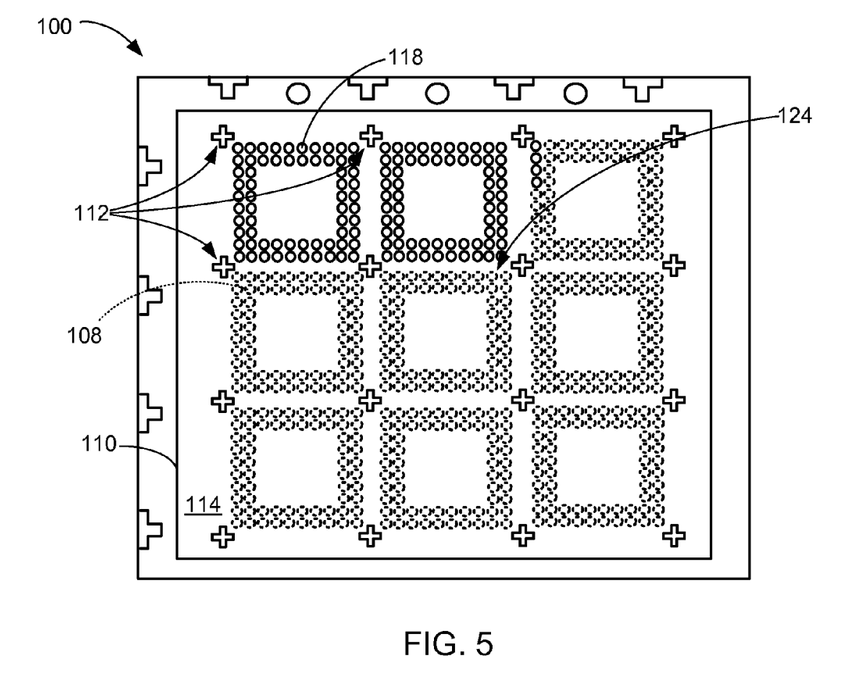
FIG. 5 is the structure of FIG. 4 in a removal phase.

Referring now to FIG. 5, therein is shown the structure of FIG. 4 in a removal phase. Shown are the patterned areas 124 and the reference markers 112 surrounding the patterned areas 124. Also, shown as hidden lines, are the electrical interconnects 108 located during the pattern recognition phase.

The openings 118 can be formed on the encapsulant 110 and aligned over the electrical interconnects 108. The openings 118 can penetrate into the encapsulant side 114 and into the encapsulant 110 during the removal phase using the removal process such as the laser ablation, the sonic drilling, or the micro-etching process.

Completion of the removal phase results in formation of the semiconductor packaging system 100 of FIG. 2. The laser ablation process can be applied to a portion of the electrical interconnects 108 exposed within the openings 118 to improve solder joint connective characteristics such as exposed surface finish, structural fit within the openings 118, or cross-sectional profile characteristics of the electrical interconnects 108.

It has been discovered that the openings 118 or the electrical interconnects 108 can be formed with precision using the laser ablation process. It has also been discovered that solder joint connective quality of the electrical interconnects 108 and the openings 118 are substantially improved using the laser ablation process.

Figure 6:
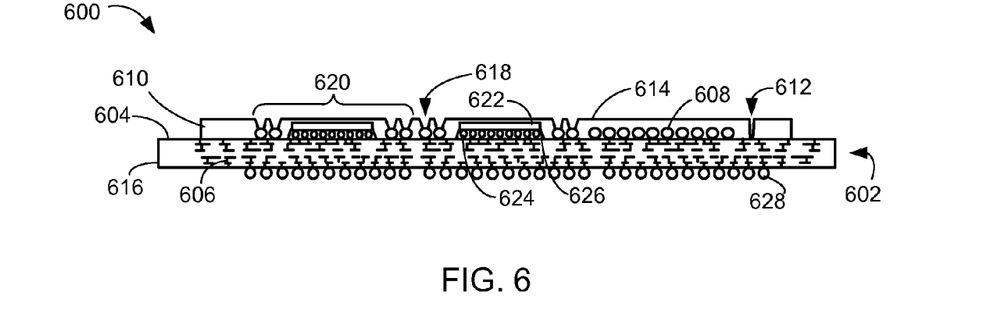
FIG. 6 is a cross-sectional view of a semiconductor packaging system taken along a line 6-6 of FIG. 7 in a second embodiment of the present invention.
Figure 7:
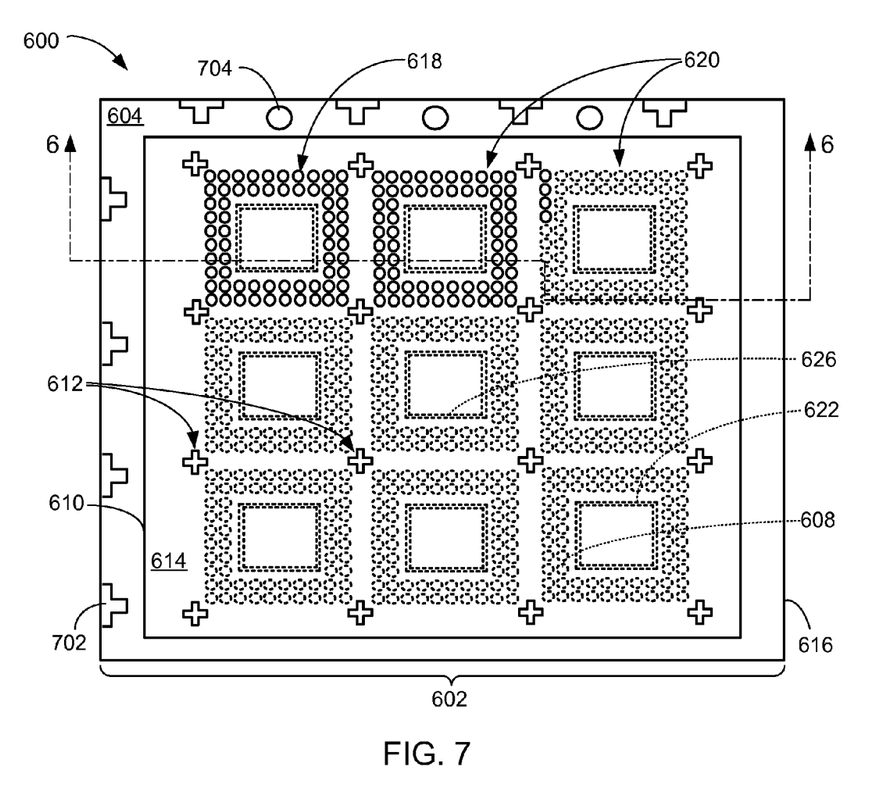
FIG. 7 is a top view of the semiconductor packaging system of FIG. 6.

Referring now to FIG. 6, therein is shown a cross-sectional view of a semiconductor packaging system 600 taken along a line 6-6 of FIG. 7 in a second embodiment of the present invention. The semiconductor packaging system 600 can preferably include a base substrate 602, such as a printed circuit board, a substrate, or a circuit board having a protected side 604, a side of the base substrate 602 opposite the protected side 604, base conductors 606, and electrical interconnects 608.

The base conductors 606 can provide electrical connectivity through the base substrate 602 including the protected side 604 and the side opposite the protected side 604. The base conductors 606 can be formed using materials that are electrically conductive.

The electrical interconnects 608, such as balls, bumps, pads, pins, leads, or solder, can preferably be mounted on the protected side 604. The electrical interconnects 608 can be electrically connected to the base conductors 606 on the protected side 604 and have different physical sizes or shapes.

An encapsulant 610 can be applied over the electrical interconnects 608 and a portion of the protected side 604. The encapsulant 610 can include reference markers 612, such as fiducial patterns, indentations, or holes, applied or formed in an encapsulant side 614 of the encapsulant 610 facing away from the protected side 604. The reference markers 612 can be formed with a laser and penetrate the encapsulant 610 from the encapsulant side 614 to the protected side 604 of the base substrate 602 or into a portion of the encapsulant 610.

Physical locations of the reference markers 612 are selected and positioned relative to edges 616, strip edge patterns 702 of FIG. 7, or assembly holes 704 of FIG. 7 of the base substrate 602. Manufacturing information based on physical locations and triangulation calculations of the edges 616, the strip edge patterns 702, or the assembly holes 704 can be used for the placement position of each of the reference markers 612. Quantity of the reference markers 612 can be determined based on distribution patterns of the electrical interconnects 608. The reference markers 612 or patterns of several of the reference markers 612 can be used to locate, triangulate, or determine physical locations of any of the electrical interconnects 608 covered or obstructed by the encapsulant 610.

The encapsulant 610 can include openings 618 such as holes, passages, apertures, or indentations over the electrical interconnects 608. A central axis of each of the openings 618 can coincide with a central axis of the electrical interconnects 608. Physical placement locations of the openings 618 are selected and positioned relative to the reference markers 612 using information based on physical locations of the reference markers 612 and triangulation calculations based on the physical locations of the reference markers 612.

The openings 618 can be formed using a removal process, such as a laser ablation, a sonic drilling, or a micro-etching process, to the encapsulant side 614. Each of the openings 618 can be perpendicular to the encapsulant side 614. The openings 618 can partially or fully expose the electrical interconnects 608 from the encapsulant 610.

The electrical interconnects 608 exposed from the encapsulant side 614 can provide electrical or thermal connectivity between the semiconductor packaging system 100 and the next level of integration such as an integrated circuit packaging, a subsystem circuit board, circuitry, test equipment, or any component capable of attaching to the electrical interconnects 608.

The electrical interconnects 608 can be distributed and patterned over the protected side 604 into plurality of patterned areas 620, such as unit, cluster, or base areas. Any of the patterned areas 620 can be shaped identically or differently from another one of the patterned areas 620. Also, any of the patterned areas 620 can have a size identical or different from another one of the patterned areas 620.

An integrated circuit device 622, such as a flip chip, a module, a package, or a passive device, can be mounted on the base substrate 602 and electrically connected to the base conductors 606 exposed on the protected side 604 of the base substrate 602. The integrated circuit device 622 can preferably be mounted within a perimeter of the encapsulant 610 over the protected side 604.

For purposes of illustration, the integrated circuit device 622 is shown covered by the encapsulant 610. The integrated circuit device 622 could optionally be exposed from the encapsulant side 614 of the encapsulant 610.

Internal interconnects 624, such as solder, pins, or leads, can be used to provide direct electrical connectivity between the integrated circuit device 622 and the base conductors 606. The internal interconnects 624 or an area between the integrated circuit device 622 and the protected side 604 can be surrounded by an underfill 626.

System connectors 628, such as solder balls, pads, pins, or leads, can be connected to the base conductors 606 exposed on the side of the base substrate 602 facing away from the integrated circuit device 622. The system connectors 628 can be used to provide connectivity between the semiconductor packaging system 600 and the next level of integration.

It has been discovered that the reference markers 612 provide accurate positional information for the purposes of locating the patterned areas 620 on the protected side 604.

Referring now to FIG. 7, therein is shown a top view of the semiconductor packaging system 600 of FIG. 6. Shown are the base substrate 602, the protected side 604 of the base substrate 602, the encapsulant 610 covering a portion of the protected side 604, the reference markers 612 in the encapsulant side 614 of the encapsulant 610, and the openings 618 of the encapsulant 610.

The strip edge patterns 702, such as fiducial marks or edge indices, or pcb symbols/characters, can be located on the edges 616 of the base substrate 602 and aligned with perimeters of any of the patterned areas 620. The strip edge patterns 702 or the edges 616 can be used to triangulate, locate, and identify positions used for the formation of the reference markers 612 as well as locating each of the patterned areas 620.

The electrical interconnects 608, the underfill 626, and the integrated circuit device 622 are located within the encapsulant 610 are shown as hidden lines. The openings 618, positioned and located relative to the reference markers 612 are formed over the electrical interconnects 608 and exposing at least a portion of the electrical interconnects 608.

For purposes of illustration, the electrical interconnects 608 within each of the patterned areas 620 are shown surrounding the integrated circuit device 622. The electrical interconnects 608 can be located anywhere within and covered by the encapsulant 610.

Also shown are the assembly holes 704 formed on the base substrate 602 between the edges 616 and the encapsulant 610. The assembly holes 704 can be used to maneuver or provide support of any manufacturing processes or specific user requirements. The assembly holes 704 can be used to provide additional referencing points used during the forming phases of the reference markers 612.

It has been discovered that the reference markers 612 provide a method of locating the electrical interconnects 608 with a greater accuracy or precision than typical methods that rely on the edges 116 for locating, triangulation, or determining the locations of the electrical interconnects 608.

Figure 8:
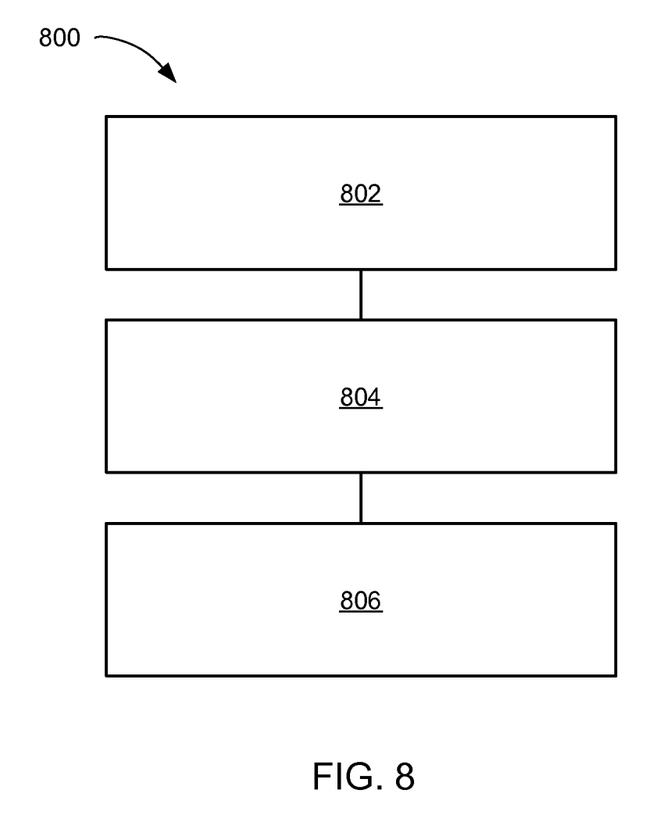
FIG. 8 is a flow chart of a method of manufacture of a semiconductor packaging system in an embodiment of the present invention.

Referring now to FIG. 8, therein is shown a flow chart of a method 800 of manufacture of a semiconductor packaging system in an embodiment of the present invention. The method 800 includes providing a base substrate having edges in a block 802; mounting an electrical interconnect on the base substrate in a block 804; and applying an encapsulant having a reference marker and an opening over the electrical interconnect, the reference marker around the electrical interconnect based on physical locations of the edges in a block 806.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a semiconductor packaging system comprising:
   providing a base substrate having edges;
   mounting an electrical interconnect on the base substrate;
   applying an encapsulant, having reference markers, over the electrical interconnect, the reference markers triangulated to a central axis of the electrical interconnect based on physical locations of the edges; and
   forming a hole, having a central axis, in the encapsulant, the central axis of the hole coincident with the central axis of the electrical interconnect, the electrical interconnect in the hole and exposed below non-horizontal sides of the hole.

2. The method as claimed in claim 1 wherein applying the encapsulant includes forming the reference markers in the encapsulant.

3. The method as claimed in claim 1 wherein applying the encapsulant includes removing a portion of the encapsulant to expose the electrical interconnect.

4. The method as claimed in claim 1 wherein:
providing the base substrate includes providing the base substrate having an assembly hole between the edges and the encapsulant; and
applying the encapsulant includes forming the reference markers in the encapsulant based on a physical location of the assembly hole.

5. The method as claimed in claim 1 further comprising:
mounting an integrated circuit device on the base substrate; and
connecting a system connector to the base substrate.

6. A method of manufacture of a semiconductor packaging system comprising:
providing a base substrate having edges and strip edge patterns on the edges;
mounting an electrical interconnect on the base substrate;
applying an encapsulant, having reference markers, over the electrical interconnect, the reference markers triangulated to a central axis of the electrical interconnect and based on physical locations of the strip edge patterns; and
forming a hole, having a central axis, in the encapsulant, the central axis of the hole coincident with the central axis of the electrical interconnect, the electrical interconnect in the hole and exposed below non-horizontal sides of the hole.

7. The method as claimed in claim 6 wherein applying the encapsulant includes forming the reference markers into a portion of the encapsulant.

8. The method as claimed in claim 6 wherein applying the encapsulant includes laser ablating a portion of the encapsulant having a central axis of the hole coincident with a central axis of the electrical interconnect.

9. The method as claimed in claim 6 wherein:
providing the base substrate includes providing the base substrate having an assembly hole between the edges and the encapsulant; and
applying the encapsulant includes forming the reference markers in the encapsulant based on a physical location of the assembly hole and the strip edge patterns.

10. The method as claimed in claim 6 further comprising:
mounting an integrated circuit device on the base substrate and covered by the encapsulant; and
connecting a system connector to the base substrate, the system connector on a side of the base substrate facing away from the integrated circuit device.

11. A semiconductor packaging system comprising:
a base substrate having edges;
an electrical interconnect mounted to the base substrate; and
an encapsulant having reference markers and a hole, the electrical interconnect in the hole and exposed below non-horizontal sides of the hole, a central axis 120 of the hole coincident with a central axis of the electrical interconnect having a physical location triangulated by the reference markers based on physical locations of the edges.

12. The system as claimed in claim 11 wherein the encapsulant includes the reference markers formed in the encapsulant.

13. The system as claimed in claim 11 wherein the encapsulant includes a portion of the encapsulant removed to expose the electrical interconnect.

14. The system as claimed in claim 11 wherein:
the base substrate having an assembly hole between the edges and the encapsulant; and
the encapsulant includes the reference markers formed in the encapsulant based on a physical location of the assembly hole.

15. The system as claimed in claim 11 further comprising:
an integrated circuit device mounted on the base substrate; and
a system connector connected to the base substrate.

16. The system as claimed in claim 11 wherein:
the base substrate having strip edge patterns on the edges; and
the encapsulant includes the reference markers based on physical locations of the strip edge patterns.

17. The system as claimed in claim 16 wherein the encapsulant includes the reference markers formed into a portion of the encapsulant.

18. The system as claimed in claim 16 wherein the encapsulant includes a central axis of the hole coincident with a central axis of the electrical interconnect.

19. The system as claimed in claim 16 wherein:
the base substrate having an assembly hole between the edges and the encapsulant; and
the encapsulant includes the reference markers formed in the encapsulant based on a physical location of the assembly hole and the strip edge patterns.

20. The system as claimed in claim 16 further comprising:
an integrated circuit device mounted on the base substrate and covered by the encapsulant; and
a system connector connected to the base substrate, the system connector on a side of the base substrate facing away from the integrated circuit device.

* * * * *